United States Patent [19]

Tsukada

[11] 4,267,467
[45] May 12, 1981

[54] TIMER CIRCUIT

[75] Inventor: Keizo Tsukada, Kawaguchi, Japan

[73] Assignee: Sony Corporation, Tokyo, Japan

[21] Appl. No.: 5,793

[22] Filed: Jan. 23, 1979

[30] Foreign Application Priority Data

Jan. 25, 1978 [JP] Japan .................................. 53-6835

[51] Int. Cl.³ ........................................ H03K 17/292
[52] U.S. Cl. .................................. 307/597; 307/246; 307/247 A; 307/141
[58] Field of Search .................... 307/243, 247 A, 293, 307/294, 246, 141, 141.8

[56] References Cited

U.S. PATENT DOCUMENTS

| 3,732,467 | 5/1973 | Mills | 307/246 X |
| 4,015,142 | 3/1977 | Nagaoka et al. | 307/247 A |
| 4,035,669 | 7/1977 | Yokoyama | 307/293 |
| 4,053,790 | 10/1977 | Myers | 307/293 X |
| 4,107,553 | 8/1978 | Carter | 307/293 |

Primary Examiner—John S. Heyman
Attorney, Agent, or Firm—Lewis H. Eslinger; Alvin Sinderbrand

[57] ABSTRACT

The maximum voltage stored in a timer storage capacitor during charging is limited to a fixed level independent of battery voltage by the junction drops of a plurality of forward biased solid state devices. The discharge time of the timer storage capacitor to a predetermined triggering level is thus also independent of battery voltage. At the triggering level, control and drive circuits interrupt the supply circuit to an electric device.

13 Claims, 4 Drawing Figures

TIMER CIRCUIT

BACKGROUND OF THE INVENTION

1. Field of the Invention

This invention relates generally to a timer circuit and more specifically is directed to a timer circuit for controlling an electric device, such as a battery operated radio or the like, in which the electric device is turned off a predetermined time after actuation of a switch. When used with a clock radio, such a timer device is known as a sleep timer.

2. Description of the Prior Art

Electric devices, such as battery operated portable radios, have been provided with timers which automatically turn off the radios a predetermined time after a switch is operated. Such timers are conveniently employed in bedside radios, for example, in order to provide music for a predetermined period of time and then to automatically shut off after the listener has fallen asleep.

In conventional timer circuits for use with battery operated devices, a storage capacitor is charged to the full battery potential and, when the switch is operated, the storage capacitor is discharged through a resistor which, with the storage capacitor, forms an RC time constant. The RC time constant determines the time at which the voltage stored in the storage capacity decays from its initial value to a triggering level at which the electric circuit from the battery through the radio is broken. As the battery voltage becomes lower with use, the lower voltage stored in the storage capacitor reduces the time between actuation of the switch and the voltage decay to the triggering level. Thus the time from switch actuation to radio shutoff becomes shorter and shorter as the battery voltage decreases with continued use.

OBJECTS AND SUMMARY OF THE INVENTION

Accordingly, it is an object of the present invention to provide a timing circuit which overcomes the above mentioned disadvantages of the prior art.

More particularly, it is an object of the present invention to provide a timing circuit which determines a delay time between the operation of a switch and the turning off of an electric device that is substantially independent of battery voltage.

It is a further object of the invention to provide a timing circuit, as aforesaid, which employs the constant voltage drop of forward biased solid state devices to establish a fixed value of voltage for storage in a storage capacitor. Upon actuation of the switch, this voltage is discharged at a predetermined rate through a resistor and a triggering level at which the electric device is turned off is attained at a fixed predetermined time after switch actuation independently of battery voltage.

According to an aspect of the invention, a timing circuit is provided for completing the electric circuit of a direct current source to an electric device comprising drive means responsive to a control voltage at an input thereof to complete the electric circuit, the drive means having maintaining means for maintaining the control voltage at a first predetermined value, timer means including storage means for storing the first predetermined value, switch means for permitting the stored voltage in the timer means to discharge at a predetermined rate, and control circuit means controlled by the stored voltage and being operative, when the stored voltage is decreased to a second predetermined value lower than the first predetermined value, to cause the drive means to interrupt the electric circuit.

DETAILED DESCRIPTION OF PREFERRED EMBODIMENTS

Figure 1:
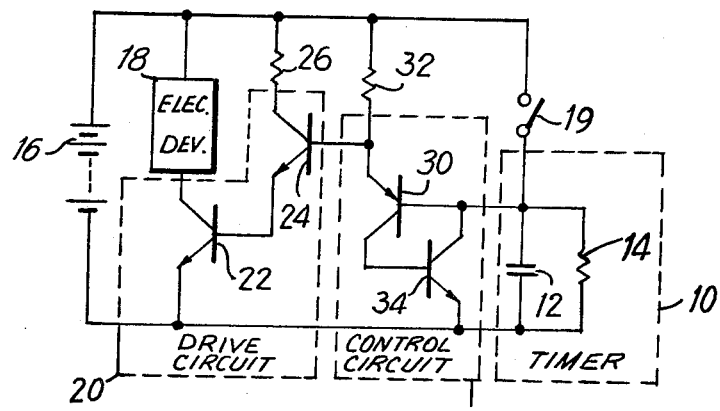
FIG. 1 is a schematic diagram of a timer circuit according to the prior art.

Referring initially to FIG. 1, it will be seen that timer 10, according to the prior art, has a storage capacitor 12 and a resistor 14 in parallel therewith, and is connectable to a battery or direct current source 16 by a switch 19.

An electric device 18, such as a radio or the like, is connected directly to one terminal of battery 16 and is connectable to the other terminal of the battery by a drive circuit 20. The drive circuit 20 contains a transistor 22 whose emitter and collector are in series between the electric device 18 and the second terminal of battery 16. A second transistor 24 in drive circuit 20 has its emitter connected to the base of transistor 22 and its collector connected through a resistor 26 to battery 16.

A control circuit 28 between timer 10 and drive circuit 20 contains a first transistor 30 having its emitter connected through a resistor 32 to battery 16 and a second transistor 34 having its base connected to the collector of the first transistor 30. The junction of the emitter of transistor 30 and resistor 32 is connected to the base of transistor 24 in drive circuit 20. The base of transistor 30 is connected to the junction of storage capacitor 12 and resistor 14 as well as to the collector of transistor 34. The emitter of transistor 34 is connected to ground.

In the condition shown in FIG. 1, and assuming that storage capacitor 12 in timer 10 is in the discharged condition, transistors 30 and 34 are turned ON and the resulting low voltage coupled from the emitter of transistor 30 to the base of transistor 24 in drive circuit 20 serves as a control voltage to hold transistor 24 cut off, which in turn, holds transistor 22 cut off. With transistor 22 in its OFF condition, the collector-emitter path therethrough for completing the electric circuit from electric device 18 to the battery 16 is broken. Therefore, electric device 18 is turned OFF.

When switch 19 is closed, battery voltage fed to the base of transistor 30 turns OFF transistor 30. This permits the control voltage at the base of transistor 24 to rise to a value of $2 V_{BE}$ (Where $V_{BE}$ is the base-emitter voltage drop of the forward biased base-emitter junction of a transistor. $V_{BE} \approx 0.7$ volts in silicon transistors.) Transistor 34 in control circuit 28 is also turned OFF due to the removal of voltage from its base by the OFF condition of transistor 30. Storage capacitor 12 in timer 10 rapidly charges to full battery voltage and remains charged so long as switch 19 is closed.

When switch 19 is opened, the charge stored in storage capacitor 12 discharges through resistor 14 at a rate which is determined by the RC time constant of the combination of capacitor 12 and resistor 14. When the voltage in storage capacitor 12 fed to the base of transistor 30 falls below $V_{BE}$, transistor 30 is turned ON. This reduces the control voltage fed to the base of transistor 24 and again turns OFF transistors 24 and 22 and turns OFF electric device 18.

The time between the opening of switch 19 and the turning OFF of electric device 18 in the prior art circuit of FIG. 1 depends upon the voltage of battery 16. As the battery voltage decreases, the time taken to reduce the voltage stored in storage capacitor 12 from its initial value equal to the battery voltage to the value $V_{BE}$ changes as shown by solid line curve A on FIG. 2. Thus, as the battery voltage is reduced from about 4 volts to about 2 volts, the time delay from the opening of switch 19 until the electric device 18 is turned OFF is changed from about 80 seconds to about 40 seconds.

Figure 3:
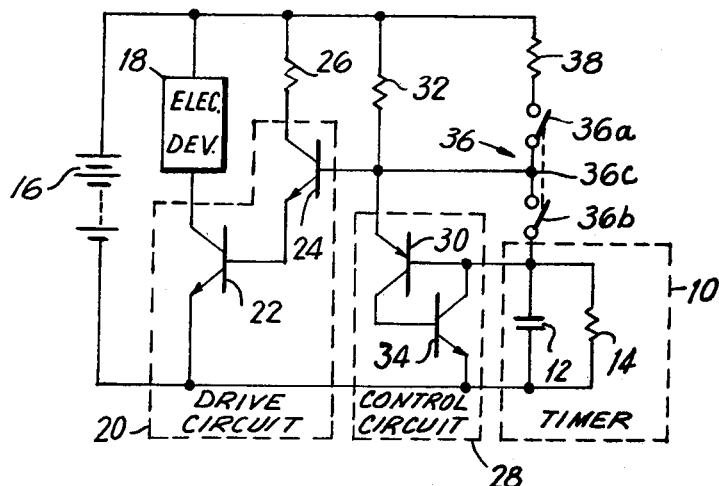
FIG. 3 is a schematic diagram of a timer circuit according to an embodiment of the present invention.

The timer circuit according to the present invention, as shown on FIG. 3, avoids the wide difference in timing which occurs in the prior art device as the battery voltage decreases with use. Timer 10, drive circuit 20 and control circuit 28 in the circuit of FIG. 3 are identical to those previously described in connection with the prior art circuit. A double-pole singlethrow switch 36 has its two contacts 36a and 36b connectable in series between a resistor 38 and storage capacitor 12 of timer 10. The junction 36c of the two switch contacts 36a and 36b is connected to the junction of the base of transistor 24 and the emitter of transistor 30.

When the contacts 36a and 36b of switch 36 are closed, the voltage fed to storage capacitor 12 is limited to the value of the control voltage at the base of transistor 24, that is, 2 $V_{BE}$, due to the connection of junction 36c to the base of transistor 24 whose base-emitter junction is in series to ground with the base-emitter junction of transistor 22. Consequently, the voltage fed to, and stored in storage capacitor 12 during the closed condition of switch contacts 36a and 36b is essentially constant at 2 $V_{BE}$ over a wide range of voltages from battery 16.

When switch contacts 36a and 36b are opened, the control voltage at the base of transistor 24 remains at 2 $V_{BE}$ and the voltage stored in storage capacitor 12 begins discharging from the stored value of 2 $V_{BE}$ through resistor 14 as previously described. When the voltage in storage capacitor 12 decreases to less than $V_{BE}$, transistor 30 is turned ON due to the presence of a voltage of 2 $V_{BE}$ at its emitter and a voltage of $V_{BE}$ at its base. This, in turn, turns ON transistor 34 in control circuit 28 and reduces the control voltage coupled to the base of transistor 24 sufficiently to cut OFF transistors 24 and 22 in drive circuit 20. The circuit through electric device 18 by way of the collector-emitter junction of transistor 22 is broken and the electric device 18 is turned OFF.

Figure 2:
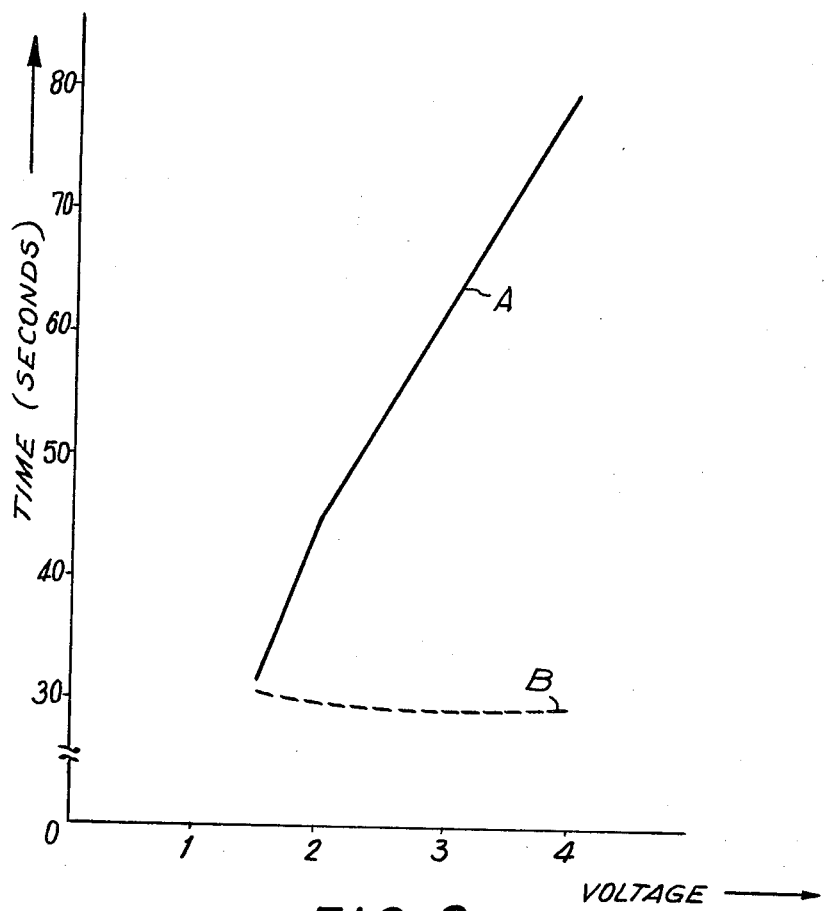
FIG. 2 is a graph showing timing curves to which reference will be made in describing the prior art and the present invention.

Since the voltage stored in storage capacitor 12 is always limited to a first fixed value of approximately 2 $V_{BE}$ and since the actuation voltage is established when the voltage stored in capacitor 12 is depleted to a second fixed value $V_{BE}$, the time between opening of switch 36 and turning OFF of electric device 18 is essentially constant, as indicated by dashed curve B of FIG. 2. As would be clear to one skilled in the art, appropriate adjustment of the RC time constant of resistor 14 and capacitor 12 can be employed to achieve a delay time of any convenient extent.

Figure 4:
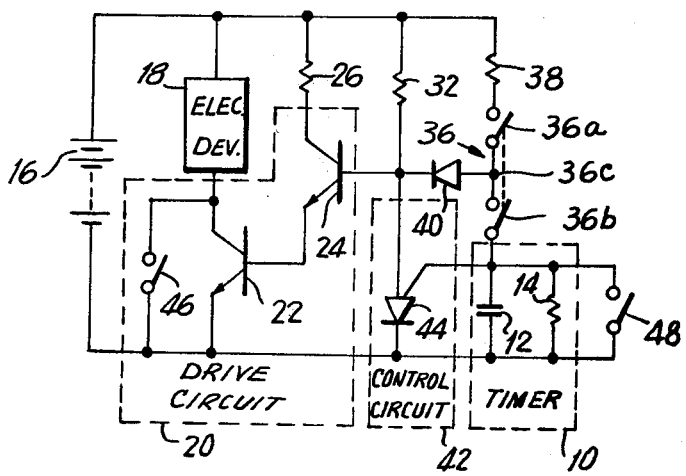
FIG. 4 is a schematic diagram of a timer circuit according to a second embodiment of the present invention.

Referring now to FIG. 4, there is shown a second embodiment of the invention in which a diode 40 is connected between junction 36c and the base of transistor 24. The control circuit 42 of this embodiment contains a programmable unijunction transistor 44 which has its anode connected to the junction of the base of transistor 24 with the cathode of diode 40, while the cathode of transistor 44 is connected to the negative terminal of battery 16. Further, the gate of programmable unijunction transistor 44 is shown to be connected to storage capacitor 12 in timer 10.

Due to the addition of diode 40, the voltage at junction 36c, when switch 36 is closed, is limited to the junction drop in forward biased diode 40 plus the base-emitter drops of transistors 24 and 22. The junction drop in a forward biased silicon diode is approximately equal to the base-emitter drop ($V_{BE}$) in the forward biased emitter-base junction of a silicon transistor. Therefore, the voltage at junction 36c of switch 36 is limited to approximately 3 $V_{BE}$. This voltage of 3 $V_{BE}$ is stored in storage capacitor 12 when switch contacts 36a and 36b are closed.

Programmable unijunction transistor 44 remains non-conductive or is turned OFF as long as its gate voltage is more positive than its anode voltage and transistor 44 conducts when the converse is true. With switch 36 closed, a voltage of 3 $V_{BE}$ is applied to the gate of programmable unijunction transistor 44 but, due to the drop in diode 40, only a voltage of 2 $V_{BE}$ is applied to its anode. Therefore, programmable unijunction transistor 44 remains OFF when switch contacts 36a and 36b are closed.

When contacts 36a and 36b of switch 36 are opened to initiate the timing cycle, the voltage stored in capacitor 12 is discharged through resistor 14 from the stored value of 3 $V_{BE}$ until the voltage on the gate electrode of programmable unijunction transistor 44 becomes less than the voltage on its anode. At that time, which occurs when the voltage stored in storage capacitor 12 has decreased to 2 $V_{BE}$, programmable unijunction transistor 44 is turned ON and thereby provides a path to ground from the base of transistor 24 so that transistors 24 and 22 are turned OFF and the electric circuit through electric device is interrupted.

A timer override switch 46 may optionally be provided for bypassing the collector-emitter junctions of transistor 22. Timer override switch 46 permits turning ON of electric device 18 without employing the remainder of the circuit. In addition, an OFF switch 48 may optionally be provided in parallel with storage capacitor 12 to instantaneously discharge the charge stored in storage capacitor 12 thereby turning ON programmable unijunction transistor 44 and immediately turning OFF the electric device 18 without waiting for the charge stored in storage capacitor 12 to decay to the triggering level.

Having described specific embodiments of the invention with reference to the accompanying drawings, it is to be understood that the invention is not limited to those precise embodiments, and that various changes and modifications may be effected therein by one skilled in the art without departing from the scope or spirit of the invention as defined in the appended claims.

What is claimed is:

1. A timing circuit for completing an electric circuit from a direct current source which generates a voltage of a potential level which may vary with time to an electric device comprising: drive means having an input and being responsive to a control voltage at said input thereof to complete said electric circuit, said drive means including maintaining means for maintaining said control voltage at a first predetermined value different from said generated voltage of said direct circuit source, timer means including storage means for storing said first predetermined value regardless of variations in the level of voltage from said direct current source, switch means for permitting a voltage stored in said timer means to discharge at a predetermined rate, and control circuit means controlled by said stored voltage and being operative, when said stored voltage has decreased to a second predetermined value lower than said first predetermined value, to change said control voltage to a value which causes said drive means to interrupt said electric circuit.

2. The timing circuit according to claim 1, wherein said maintaining means includes at least two junction drops of a plurality of forward biased solid state devices, which junction drops are arranged in series.

3. A timing circuit for completing an electric circuit from a direct current source to an electric device comprising:
- drive means having an input and being responsive to a control voltage at said input thereof to complete said electric circuit, said drive means including maintaining means for maintaining said control voltage at a first predetermined value, and said maintaining means including at least two junction drops of a plurality of forward biased solid state devices, which junction drops are arranged in series;
- timer means including storage means for storing said first predetermined value;
- switch means for permitting a voltage stored in said timer means to discharge at a predetermined rate, said switch means having first and second ganged contacts connected in series between a resistor connected to a terminal of said direct current source and said storage means, and wherein a junction between said ganged contacts is connected to said input of said drive means; and
- control circuit means controlled by said stored voltage and being operative, when said stored voltage has decreased to a second predetermined value lower than said first predetermined value, to change said control voltage to a value which causes said drive means to interrupt said electric circuit.

4. The timing circuit according to claim 3, wherein said control circuit means includes at least one transistor connected between said input of said drive means and ground.

5. The timing circuit according to claim 3, wherein said control circuit means includes a programmable unijunction transistor having an anode connected to the input of said drive means, a cathode connected to a second terminal of said direct current source and a gate to which said stored voltage is applied.

6. A timing circuit for completing an electric circuit from a direct current source to an electric device comprising: a plurality of solid state devices having forward biased junction drops connectable in series between a resistor connected to a first terminal of said direct current source and a second terminal of said direct current source, at least one of said junction drops being a base-emitter junction of a transistor which has an emitter and a collector connected in series with said electric circuit, a storage device connectable to said resistor, switch means having first and second conditions, said first condition connecting said resistor to said plurality of solid state devices and connecting said storage device to said resistor, said transistor being turned ON by a current from said resistor so as to complete an electric circuit through said electric device, said second condition of the switch means disconnecting all of said resistor, said plurality of solid state devices and said storage device from each other, resistance-capacitance time constant means for controlled discharge of the voltage stored in said storage device at a predetermined rate from a first voltage to a second voltage, and control circuit means operative in response to the stored voltage reaching said second voltage to turn OFF said transistor whereby said electric circuit is broken.

7. A timing circuit comprising: a storage capacitor, a first resistor connected in parallel with said storage capacitor to form therewith a resistance-capacitance time constant circuit, a control circuit having an input connected to said storage capacitor and an output, a drive circuit connectable between an electric device and one terminal of a direct current source for completing an electric circuit to said electric device, said drive circuit having an input connected to said output of said control circuit, a second resistor connected to a terminal of said direct current source, first and second switch contacts connected in series between said second resistor and said storage capacitor, and a common junction between said first and second switch contacts connected to said input of said drive circuit.

8. The timing circuit according to claim 7, wherein said control circuit includes first and second transistors.

9. The timing circuit according to claim 7, wherein said control circuit includes a programmable unijunction transistor.

10. The timing circuit according to claim 7, further comprising a diode havng an anode terminal connected to said common junction and a cathode terminal connected to the input of said drive circuit.

11. The timing circuit according to claim 7, further comprising a switch in parallel with said storage capacitor.

12. The timing circuit according to claim 7, wherein said drive circuit includes a first transistor having an emitter and collector in series between said electric device and said one terminal of the direct current source, a second transistor having a base-emitter junction in series with a base-emitter junction of said first transistor, the base of said second transistor being the input to said drive circuit.

13. The timing circuit according to claim 6, further comprising a switch connected in parallel with the emitter and collector of said transistor.

* * * * *